(12) United States Patent
Masliah

(10) Patent No.: US 8,008,731 B2
(45) Date of Patent: Aug. 30, 2011

(54) IGFET DEVICE HAVING A RF CAPABILITY

(75) Inventor: Denis Masliah, Saint-German-en-Laye (FR)

(73) Assignee: Acco, Saint-Germain-en-Laye (FR)

( * ) Notice: Subject to any disclaimer, the term of this patent is extended or adjusted under 35 U.S.C. 154(b) by 0 days.

(21) Appl. No.: 12/089,711

(22) PCT Filed: Oct. 12, 2005

(86) PCT No.: PCT/IB2005/003029
§ 371 (c)(1),
(2), (4) Date: Apr. 10, 2008

(87) PCT Pub. No.: WO2007/042850
PCT Pub. Date: Apr. 19, 2007

(65) Prior Publication Data
US 2008/0224233 A1    Sep. 18, 2008

(51) Int. Cl.
*H01L 29/78* (2006.01)
(52) U.S. Cl. ........ 257/386; 257/368; 257/355; 257/256; 257/261; 257/262; 257/272; 257/273; 257/274; 257/E29.255
(58) Field of Classification Search .......... 257/386, 257/335, E29.255, 368, 256, 261, 262, 272–274, 257/288
See application file for complete search history.

(56) References Cited

U.S. PATENT DOCUMENTS

| 4,523,111 A | 6/1985 | Baliga |
| 4,811,075 A | 3/1989 | Eklund |
| 5,061,903 A | 10/1991 | Vasile |
| 5,126,807 A | 6/1992 | Baba et al. |
| 5,559,049 A | 9/1996 | Cho |

(Continued)

FOREIGN PATENT DOCUMENTS

EP    0609009 A2    1/1996

(Continued)

OTHER PUBLICATIONS

PCT/US10/41985 Int'l Search Report and Written Opinion, Sep. 9, 2010.

(Continued)

*Primary Examiner* — Lynne Gurley
*Assistant Examiner* — Naima Kearney
(74) *Attorney, Agent, or Firm* — Peters Verny, LLP

(57) ABSTRACT

An IGFET device includes: —a semiconductor body (2) having a major surface, —a source region (3) of first conductivity type abutting the surface, —a drain region (6,7) of the first conductivity-type abutting the surface and spaced from the source region with a channel (5) therefrom, —an active gate (8) overlying the channel and insulated from the channel by a first dielectric material (9) forming the gate oxide of the IGFET device, —a dummy gate (10) positioned between the active gate and the drain and insulated from the active gate by a second dielectric material so that a capacitance is formed between the active gate and the dummy gate, and insulated from the drain region by the gate oxide, wherein the active gate and the dummy gate are forming the electrodes of the capacitance substantially perpendicular to the surface.

16 Claims, 7 Drawing Sheets

U.S. PATENT DOCUMENTS

| | | | |
|---|---|---|---|
| 5,898,198 | A | 4/1999 | Herbert et al. |
| 5,912,490 | A | 6/1999 | Hebert et al. |
| 6,061,008 | A | 5/2000 | Abbey |
| 6,061,555 | A | 5/2000 | Bultman et al. |
| 6,088,484 | A | 7/2000 | Mead |
| 6,300,835 | B1 | 10/2001 | Seely et al. |
| 6,384,688 | B1 | 5/2002 | Fujioka et al. |
| 6,570,518 | B2 | 5/2003 | Riley et al. |
| 6,633,195 | B2 | 10/2003 | Baudelot et al. |
| 6,703,684 | B2 | 3/2004 | Udrea et al. |
| 6,784,470 | B2 | 8/2004 | Davis |
| 7,049,669 | B2 | 5/2006 | Ma et al. |
| 7,162,042 | B2 | 1/2007 | Spencer et al. |
| 7,312,481 | B2 | 12/2007 | Chen et al. |
| 7,522,079 | B1 | 4/2009 | Wu |
| 7,808,415 | B1 | 10/2010 | Robbe et al. |
| 2005/0287966 | A1 | 12/2005 | Yoshimi et al. |
| 2006/0228850 | A1* | 10/2006 | Tsai et al. .................... 438/219 |
| 2008/0031382 | A1 | 2/2008 | Aoki |

FOREIGN PATENT DOCUMENTS

| | | |
|---|---|---|
| GB | 2336485 A1 | 10/1999 |
| WO | 99/56311 A | 11/1999 |
| WO | WO 01/39451 A1 | 5/2001 |
| WO | WO0139451 | 5/2001 |
| WO | WO2006054148 | 5/2006 |
| WO | WO2007042850 | 4/2007 |

OTHER PUBLICATIONS

EP 05 791 809.6, Communication pursuant to Article 94(3), Aug. 17, 2010.

EPO Application 05791809.6 Response of Applicant to the first Examination Report, Feb. 23, 2011.

Azakkour, A. et al., "Challenges for a new integrated Ultra-wideband (UWB) source," IEEE, 2003 pp. 433-437.

Azakkour, A. et al., "A new integrated moncycle generator and transmitter for Ultra-wideband (UWB) communications," IEEE Radio Frequency Circuits Symposium, 2005 pp. 79-82.

Choia, Y. H. et al., "Gated UWB Pulse Signal Generation," IEEE, 2004 pp. 122-124.

Vaes, H. M. J. et al., "High Voltage, High Current Lateral Devices," IEDM Technical Digest, 1988, pp. 87-90.

Pocha, Michael D. et al. "Threshold Voltage Controllability in Doulbe-Diffused MOS Transistors," IEEE Transactions on Electronic Devices, vol. ED-21, No. 12, Dec. 1994.

PCT/US2008/001938 Int'l Search Report, Jun. 26, 2008.

PCT/IB05/003426 Int'l Search Report, Mar. 20, 2006.

PCT/IB05/003426 Written Opinion, May 16, 2007.

PCT/IB05/003029 Int'l Search Report, Jul. 6, 2006.

PCT/IB05/003029 Written Opinion, Mar. 12, 2008.

Gautier, D., et al., "Improved Delta Sigma Modulators for High Speed Applications," Acco Semiconductors, Mar. 25, 2009.

* cited by examiner

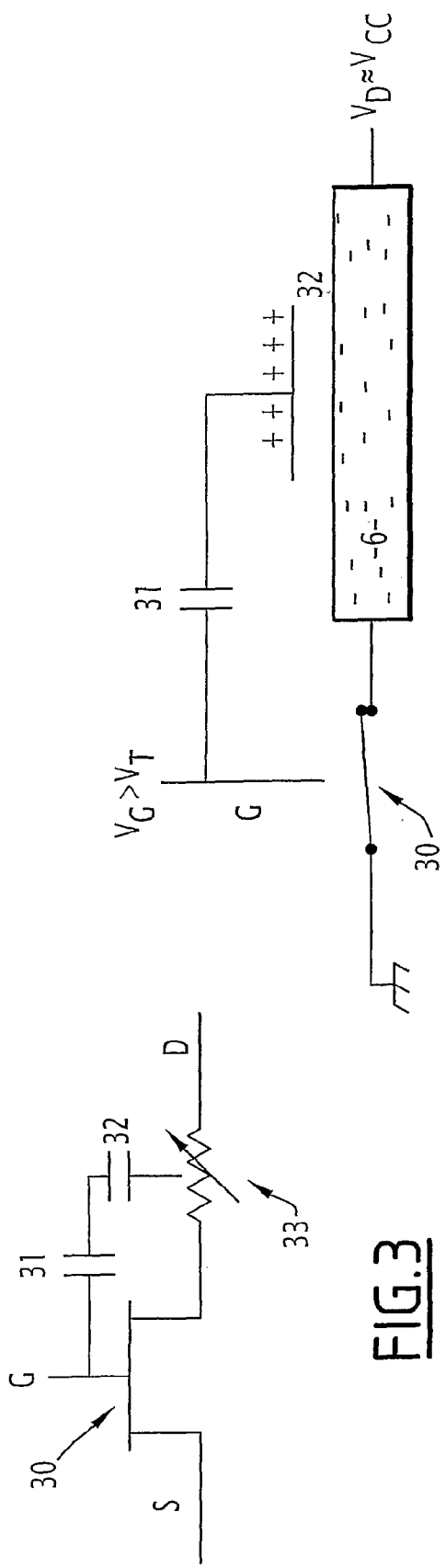
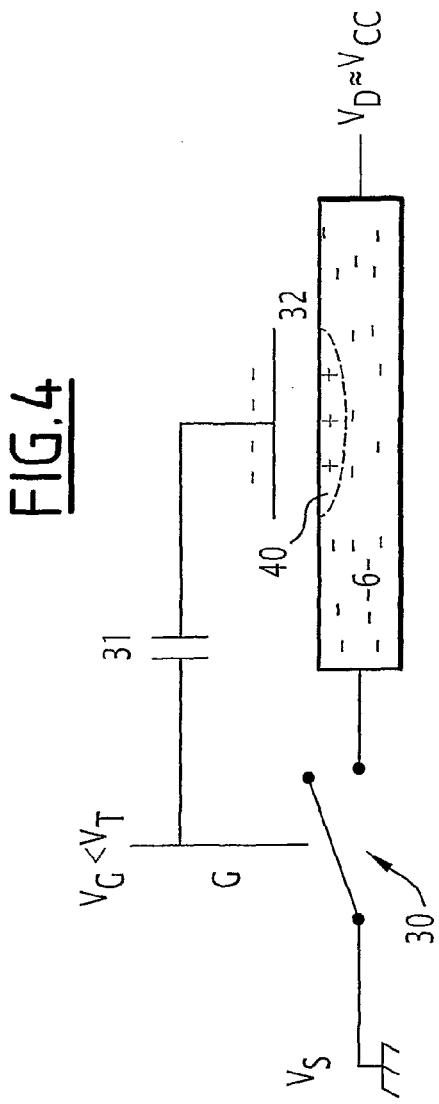

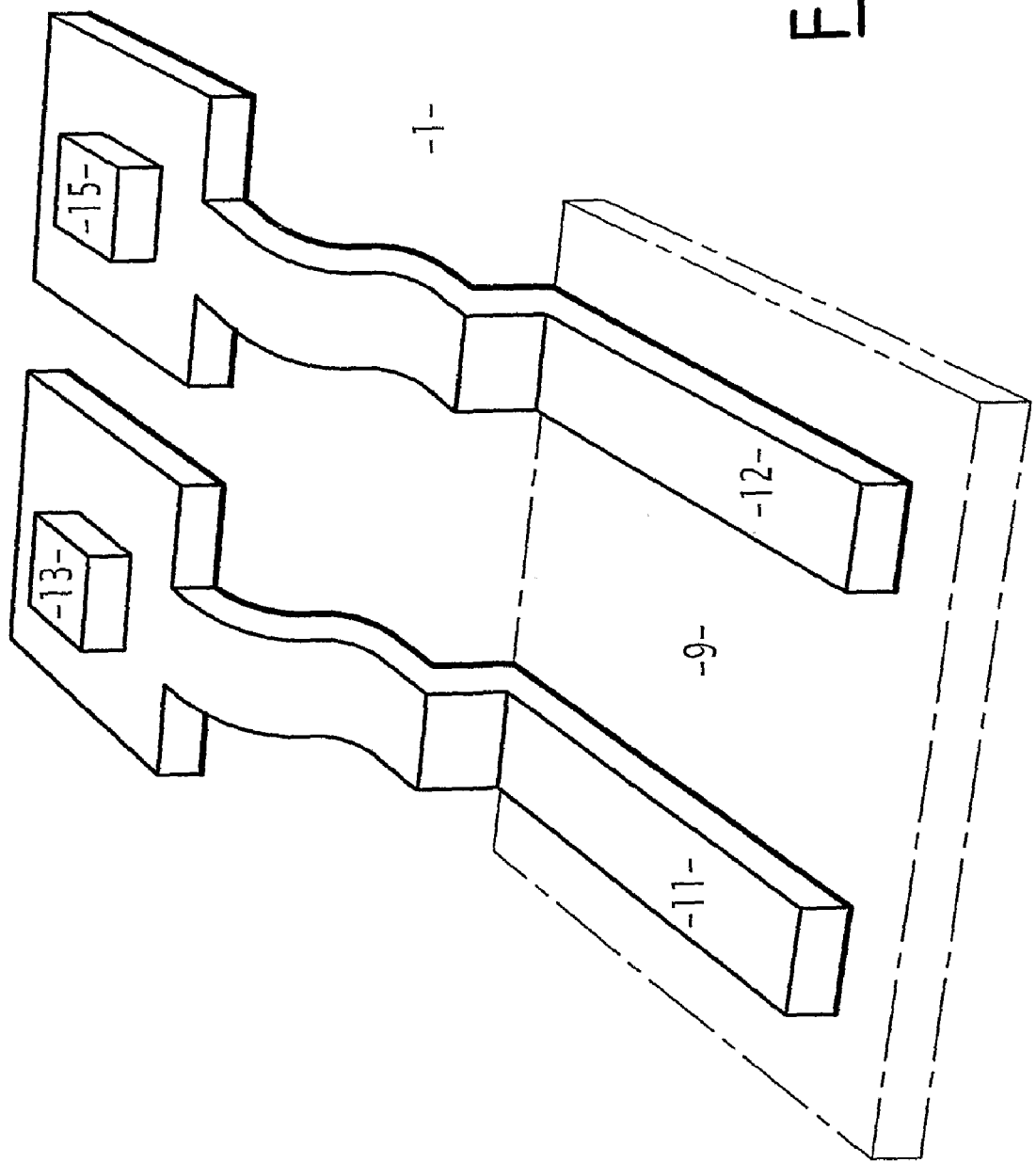

US 8,008,731 B2

IGFET DEVICE HAVING A RF CAPABILITY

FIELD OF THE INVENTION

This invention relates generally to insulated gate field-effect transistors (IGFETS).

BACKGROUND OF THE INVENTION

Herbert et al, U.S. Pat. No. 5,912,490 discloses a FET structure having a reduced drain to gate capacitance by providing a buried shield plate underlying the gate and between the gate and drain of the transistor. Use of a buried shield between the gate and drain of a field effect transistor can reduce gate to drain capacitance and maximizes the frequency response of the IGFETS.

As a result of this improvement in frequency response, the breakdown voltage of drain to substrate is lowered.

It appears that a compromise needs to be made between the reduction of gate to drain capacitance to increase the frequency response and the breakdown voltage of drain to substrate.

The goal of the invention is directed to a MOSFET structure having higher operation voltage and higher breakdown capability, while keeping a high frequency behaviour and a high density.

SUMMARY OF THE INVENTION

In accordance with the invention, an IGFET device comprises:
- a semiconductor body having a major surface,
- a source region of first conductivity type abutting said surface,
- a drain region of said first conductivity-type abutting said surface and spaced from said source region with a channel therefrom,
- an active gate overlying said channel and insulated from the channel by a first dielectric material forming the gate oxide of the IGFET device,
- a dummy gate is positioned between said active gate and said drain and is insulated from the active gate by a second dielectric material so that a capacitance is formed between the active gate and the dummy gate, and is insulated from the drain region by said gate oxide, wherein the active gate and the dummy gate are forming the electrodes of said capacitance substantially perpendicular to said surface.

According to an aspect of the invention, the dummy gate and the active gate comprise a stack of multiple metal layers in parallel forming electrode of said capacitance.

Pursuant of another aspect of the invention said stack is connected to a polysilicon layer and the stack can be disposed on top of the polysilicon layer.

Advantageously, the invention can be applied to MOSFET and LDMOS transistors.

BRIEF DESCRIPTION OF THE DRAWINGS

FIG. 3 is the equivalent electrical circuit of the LDMOS of FIG. 1,

FIGS. 4 and 5 are the equivalent electrical circuits of the LDMOS of FIG. 1 in two different modes of conduction;

FIG. 11 is a perspective view of an IGFET in accordance with another embodiment of the invention.

DESCRIPTION OF THE PREFERRED EMBODIMENTS

Figure 1:
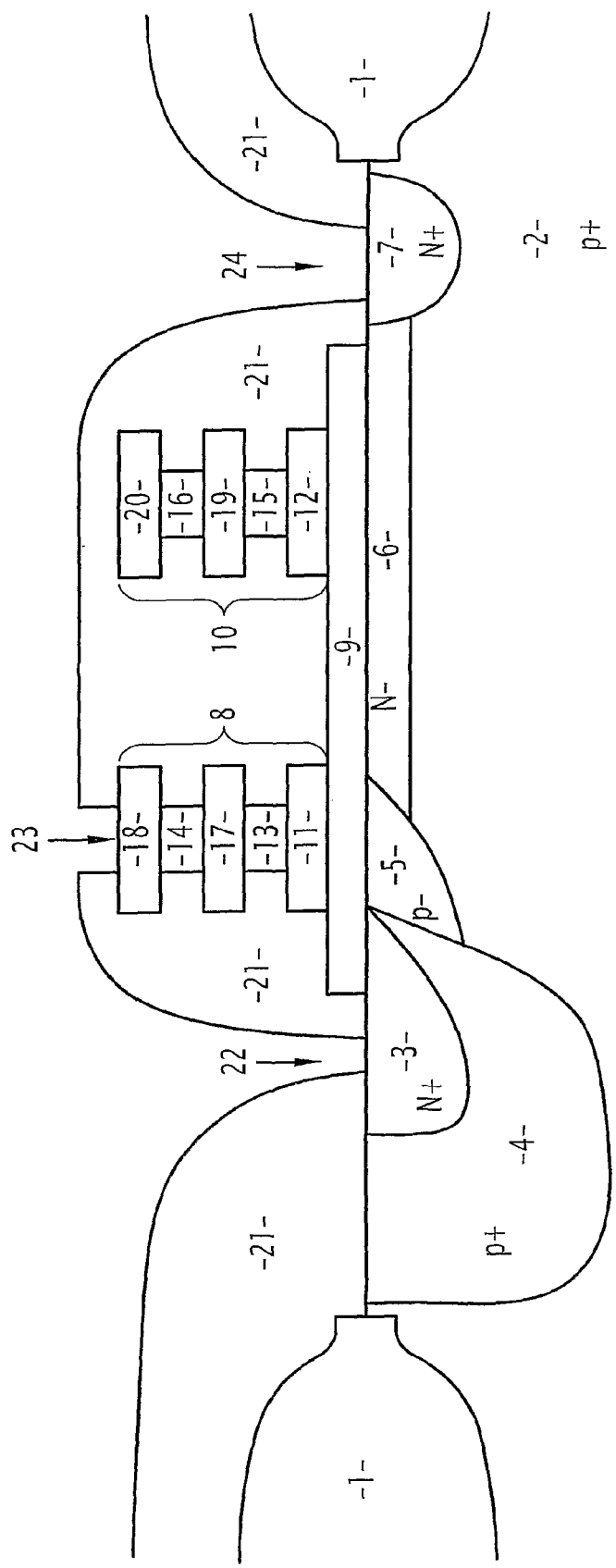
FIG. 1 is a section view of a LDMOS in accordance with an embodiment of the invention.

The FIG. 1 is a section view of a lateral double-diffused field effect transistor, or LDMOS, in accordance with one embodiment of the invention. Field oxide 1 defines a device region in the surface of a P+ substrate 2. A $N^+$ source region 3 is formed in a P+ base region 4 by double-diffusion processing with base region 4 having a $P^-$ doped extension 5 which defines a channel region of the transistor. $N^-$ doped region 6 and $N^+$ doped region 7 define the drain of the transistor. An active gate 8 is formed over channel 5 with a gate oxide 9 electrically separating the active gate 8 from channel 5 and substrate 2.

In accordance with the invention, a dummy gate 10 is provided between active gate 8 and the $N^+$ doped region 7 of the drain, on top of the $N^-$ region 6. The gate oxide 9 is electrically isolating the dummy gate 10 from the $N^-$ region 6.

The active gate 8 and the dummy gate 10 are composed of a stack having a first layer of polysilicon 11, 12. On top of this polysilicon layer, metal contacts 13, 14, 15, 16 and metal layers 17, 18, 19, 20 are alternatively disposed.

Dielectric material 21 (e.g., silicon-nitride) is provided on the surface of the device with openings there through for forming a source contact 22, a gate contact 23 and a drain contact 24.

Figure 2:
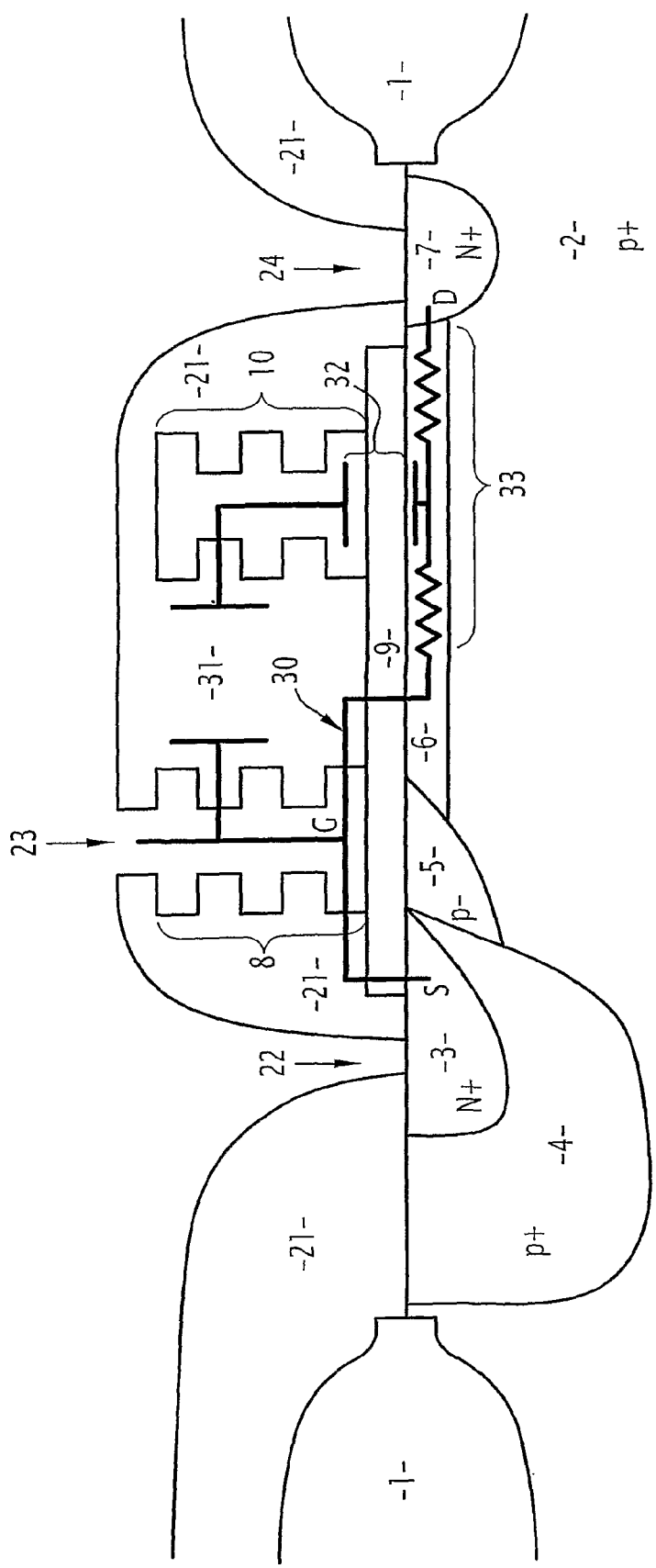
FIG. 2 is the equivalent electrical circuit of the LDMOS of FIG. 1.

Superimposed on the section view of the structure, the equivalent electrical circuit is represented in FIG. 2. The equivalent electrical circuit of this structure is composed of the transistor 30 with its source S, gate G and drain D. By providing the dummy gate 10 between the active gate 8 and the $N^+$ doped region 7 of the drain, i.e. on top of the drain region 6, the dummy gate 10 and the active gate 8 form a capacitance 31. Therefore, the dummy gate 10 is being electrically connected to the active gate 8 through this capacitance 31. The dummy gate 10 and the $N^-$ region 6 are forming a second capacitance 32 with the gate oxide 9 forming the dielectric part of the capacitance 32.

The $N^-$ region 6 is equivalent, FIG. 2 or 3, to a variable resistor 33 controlled by the capacitance 32 as it is explained below.

In an IGFET, the electrical conduction is normally from drain to source, in a conduction direction which is transverse to the direction of elongation of the gate conductor 8. Therefore, in a LDMOS such as the one described here, the source voltage is always at the lowest voltage, generally at GROUND level and the drain voltage is, in DC mode, at the supply voltage Vcc.

In a static view of operation of this transistor, two modes can be distinguished: a first mode where the voltage $V_G$ applied to the active gate 8 is higher than the threshold voltage $V_T$ of the transistor and a second mode where the voltage $V_G$ applied to the active gate 8 is below this threshold voltage $V_T$.

In the first mode, FIG. 4, the channel region is electrically conducting. Due to the capacitive coupling between the capacitors 31 and 32, the voltage applied to the $N^-$ region 6 by the dummy gate 10 is of the same order of magnitude as the drain voltage Vd. Therefore, the dummy gate 10 has almost no effect on the electrical conduction of the $N^-$ region 6.

In the second mode, FIG. 5, the channel region 5 is electrically open. The voltage applied to the N⁻ region 6 by the dummy gate 10 is roughly at GROUND level and substantially different to the drain voltage Vd. This voltage difference induces an increase of the depleted area 40 of the N⁻ region 6. Consequently the electrical sectional area of this N⁻ region 6, in which conduction takes place, is reduced and the resistance is increased.

Advantageously, the resistance of the N⁻ region 6 is varying with the gate voltage: the resistance is low when the gate voltage Vg is above the threshold voltage Vt and the transistor is conducting and the resistance is high when the gate voltage Vg is below the threshold voltage Vt and the transistor is open.

A classical LDMOS structure is described, for instance, in M. D. Pocha, A. G. Gonzales, and R. W. Dutton, IEEE Trans. on Electron Devices, ED-21, 778 (1974). Compared to this structure, the variable resistance of the above described transistor boasts high-frequency operation as the transistor has a low resistance between drain and source when it is conducting. At the same time, the transistor has a high drain-breakdown voltage as the resistance is high when the transistor is open.

Fabrication of the device of FIG. 1 requires no complex or costly processing and is based on standard MOSFET technology.

Figure 6:
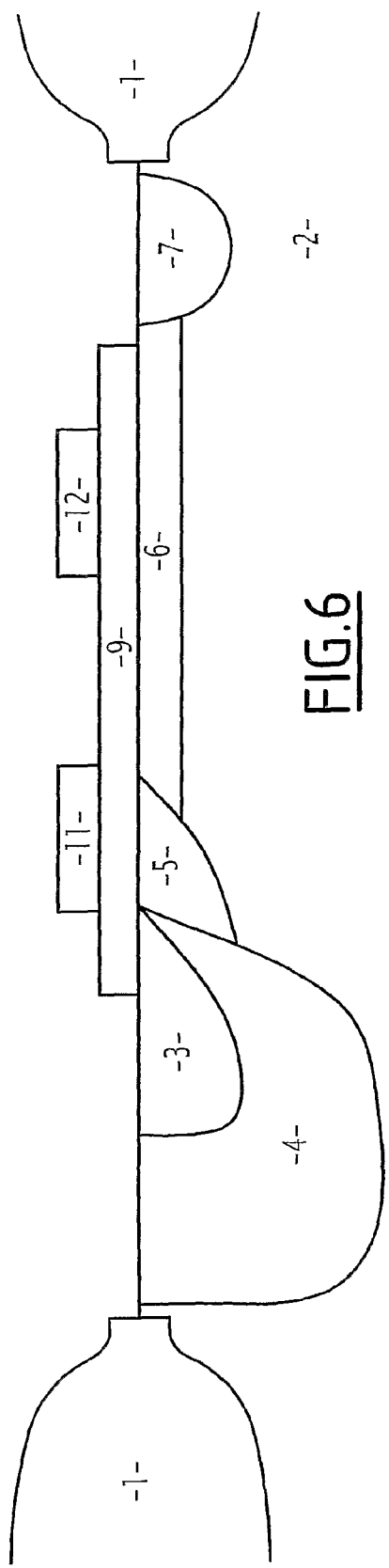
FIGS. 6 to 9 are the section view of the LDMOS of FIG. 1 during different steps of processing.

The FIG. 6 is a section view of the device with the basic transistor structures already implemented. Conventional polysilicon fabrication processes are used to obtain this structure.

The first layer 12 of the dummy gate and first layer 11 of the active gate are made simultaneously of polysilicon.

Figure 7:
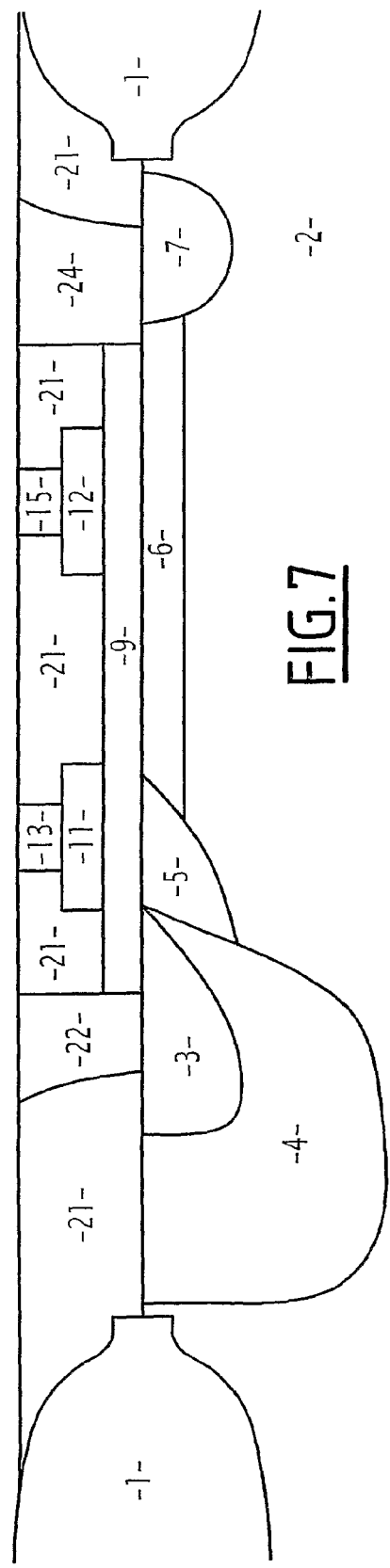

The FIG. 7 is a section view of the device at the next step of the manufacturing process. Metal contacts 13,15 are formed on top of the layers 11, 12 after the deposition and planarization of a dielectric material 21.

Figure 8:
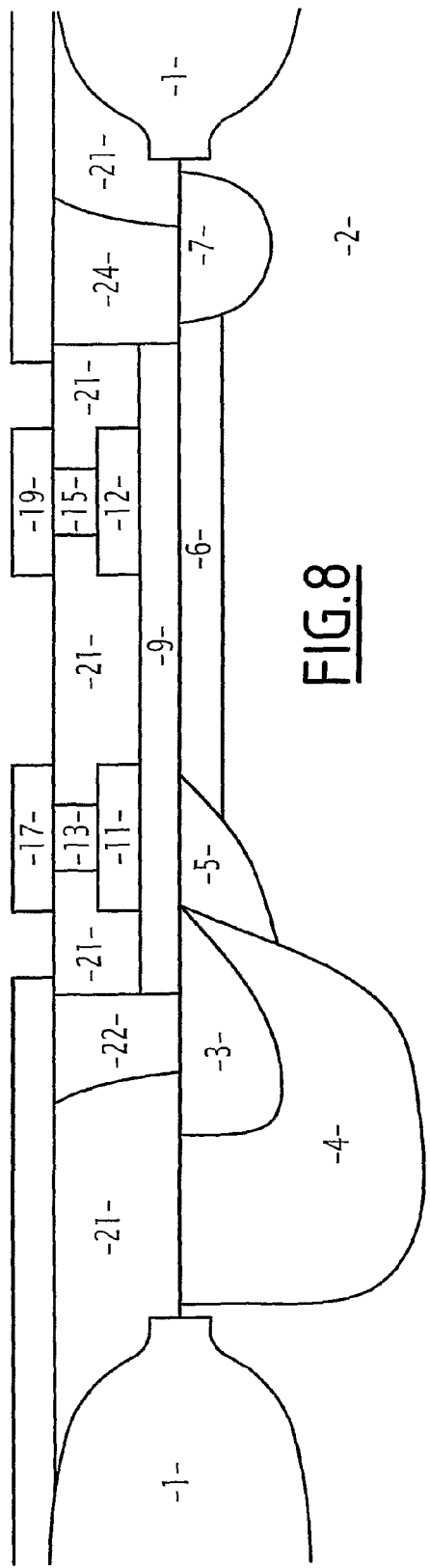

Then a metal layer is deposited and etched, FIG. 8, to form the first level of metal interconnection as well as a first metal stack 17, 19 on the metal contacts 13, 15.

Figure 9:
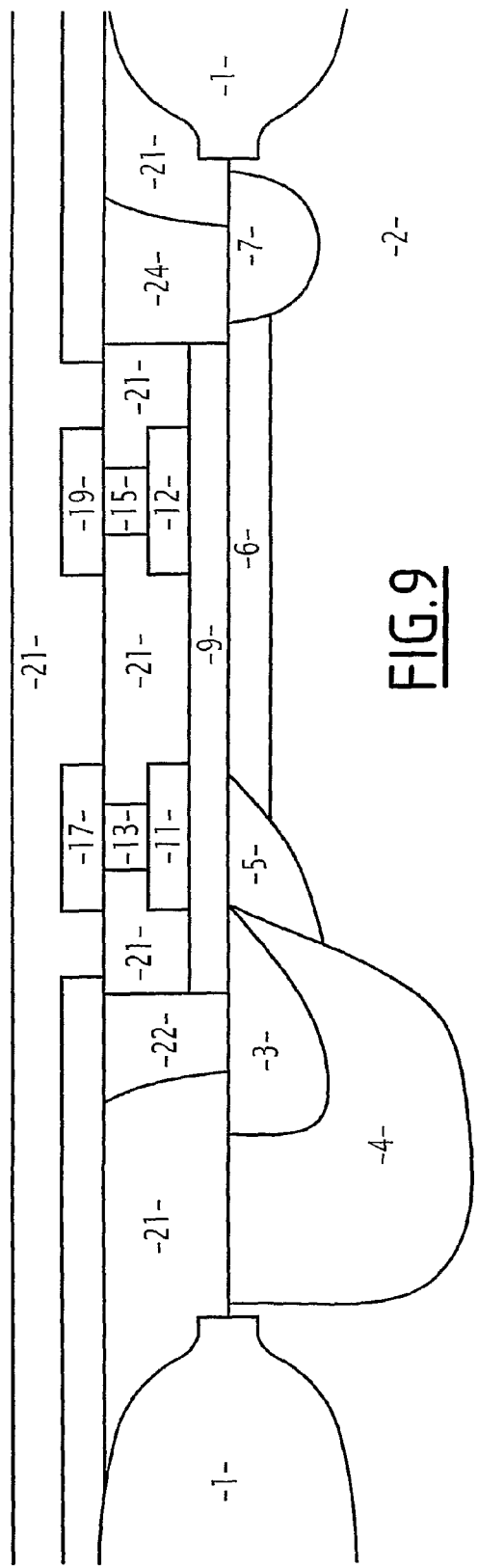

A dielectric material 21 is deposited, FIG. 9, and planarized to protect the underlying structure and prepare the structure to receive a new metal interconnection level.

Depending on the technology used, more than 2 metal interconnection layers are commonly manufactured.

From the description here above, the person skilled in the art understands that any standard MOS technology with two or more conductive interconnection layers such as aluminium, copper or polysilicon layers and the like, can be used to implement the invention.

The choice of technology defines the number of metal layers which can be stacked as well as the distance between the layers of the active gate and the layers of the dummy gate. These two parameters and the characteristics of the dielectric material define the value of the capacitance formed by the active gate and the dummy gate and, consequently, the behaviour of the transistor.

For instance, a 0.18 µm technology sees an improvement of the breakdown capability in RF from 7 Volts to over 12 Volts. For a 0.13 µm, an improvement is from 3 or 4 Volts to 8 Volts.

The description of this embodiment of the invention is based on a LDMOS transistor. However, the invention is not limited to this type of Field-Effect transistors but is useful in all types of IGFET.

Figure 10:
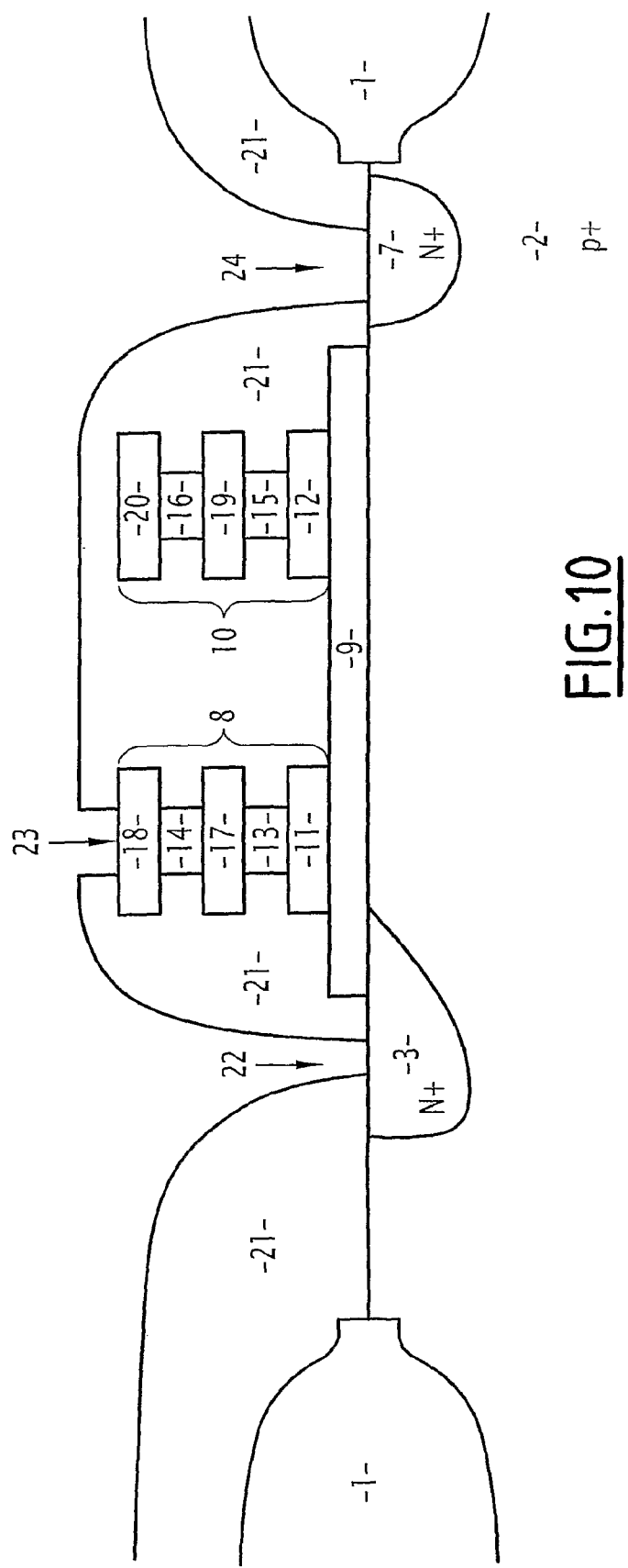
FIG. 10 is the section view of a MOS in accordance with another embodiment of the invention.

For instance, another embodiment of this invention is illustrated in FIG. 10 with a MOSFET in which the dummy gate 10 is implemented along the drain region 7, where the N⁻ region is realized with the Nwell implantation.

For illustrative purposes, the stack of contacts and metal layers has been represented on top of each other above the transistor active area. However, some design rules for specific technologies forbid the implementation of a contact, or a via, directly above the polysilicon gate. The person skilled in the art understands that the shift of the contacts used to create the active and dummy gates outside the active area will not modify the operation of the transistor. Such an implementation is illustrated in FIG. 11. In the FIG. 11, only the polysilicon layers 11, 12 and the first contacts 13, 15 on top of the gate oxide 9 and the field oxide 1 are shown with an objective of clarity.

The person skilled in the art understands that the figures were drawn to illustrate the different embodiments and are not representative of the real dimension of the transistors or of the specificity of a particular technology. For instance, the gate oxide 9 of FIG. 1 could be limited to the area under the gate polysilicon without modifying the operation of the transistor.

The description is illustrative of the invention and is not to be construed as limiting the invention. Various modifications and applications may occur to those skilled in the art without departing from the invention as defined in the claims.

The invention claimed is:

1. A IGFET device comprising:
   a semiconductor body having a major surface,
   a source region of first conductivity type abutting said surface,
   a drain region of said first conductivity-type abutting said surface and spaced from said source region with a channel therefrom,
   an active gate overlying said channel and insulated from the channel by a first dielectric material forming the gate oxide of the IGFET device,
   a dummy gate is positioned between said active gate and said drain region and is insulated from the active gate by a second dielectric material so that a capacitance is formed between the active gate and the dummy gate, and is insulated from the drain region by said gate oxide, wherein
   the active gate and the dummy gate forming the electrodes of said capacitance are disposed substantially perpendicular to said surface, and wherein the second dielectric material completely covers an entire top surface of the dummy gate, and
   wherein an opening is disposed through the second dielectric material to the active gate.

2. A IGFET device according to claim 1, wherein the dummy gate and the active gate comprise a stack of multiple conductive layers in parallel forming the electrodes of said capacitance.

3. A IGFET device according to claim 2, wherein said stack is connected to a polysilicon layer.

4. A IGFET device according to claim 3, wherein said stack is disposed on top of the polysilicon layer.

5. A IGFET device according to claim 1, wherein the device is a MOSFET.

6. A IGFET device according to claim 1, wherein the device is a LDMOS transistor.

7. A IGFET device according to claim 2, wherein the device is a MOSFET.

8. A IGFET device according to claim 3, wherein the device is a MOSFET.

9. A IGFET device according to claim 4, wherein the device is a MOSFET.

10. A IGFET device according to claim 2, wherein the device is a LDMOS transistor.

11. A IGFET device according to claim 3, wherein the device is a LDMOS transistor.

12. A IGFET device according to claim 4, wherein the device is a LDMOS transistor.

13. A IGFET device according to claim 5, wherein the device is a LDMOS transistor.

14. A IGFET device according to claim 7, wherein the device is a LDMOS transistor.

15. A IGFET device according to claim 8, wherein the device is a LDMOS transistor.

16. A IGFET device according to claim 9, wherein the device is a LDMOS transistor.

* * * * *